(12) United States Patent  (10) Patent No.: US 12,456,624 B2
Hwang  (45) Date of Patent: Oct. 28, 2025

(54) SEMICONDUCTOR DEVICE AND METHOD FOR FABRICATING THE SAME

(71) Applicant: SK hynix Inc., Gyeonggi-do (KR)

(72) Inventor: Se Ra Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 647 days.

(21) Appl. No.: 17/857,473

(22) Filed: Jul. 5, 2022

(65) Prior Publication Data

US 2023/0187212 A1    Jun. 15, 2023

(30) Foreign Application Priority Data

Dec. 15, 2021  (KR) .................. 10-2021-0179567

(51) Int. Cl.
*H01L 21/30* (2006.01)
*H01L 21/768* (2006.01)
*H01L 23/522* (2006.01)
*H10B 12/00* (2023.01)

(52) U.S. Cl.
CPC .... *H01L 21/3003* (2013.01); *H01L 21/76829* (2013.01); *H01L 21/76877* (2013.01); *H01L 23/5226* (2013.01); *H10B 12/315* (2023.02); *H10B 12/34* (2023.02); *H10B 12/50* (2023.02)

(58) Field of Classification Search
CPC .......... H01G 9/012; H01G 9/28; H01G 9/055; H01G 9/10; H01G 9/15; H01G 9/048; H01G 2/06; H01G 4/228; H01G 4/33; H01G 9/14; H01G 9/26; H01L 23/49827; H02M 3/003; H02M 3/156; G05F 1/56
See application file for complete search history.

(56) References Cited

U.S. PATENT DOCUMENTS

| | | | |
|---|---|---|---|
| 6,268,299 B1 | 7/2001 | Jammy et al. | |
| 10,566,284 B2 | 2/2020 | Kim et al. | |
| 11,282,742 B2* | 3/2022 | Shih | H01L 21/76849 |
| 2005/0110153 A1 | 5/2005 | Wu et al. | |
| 2009/0078974 A1* | 3/2009 | Nagai | H10F 39/024 |
| | | | 257/E31.127 |
| 2020/0035613 A1 | 1/2020 | Kim et al. | |
| 2022/0122903 A1* | 4/2022 | Yue | H01L 23/481 |

FOREIGN PATENT DOCUMENTS

| | | |
|---|---|---|
| KR | 10-2014-0028948 A | 3/2014 |
| KR | 10-2020-0011069 A | 2/2020 |
| KR | 10-2021-0106334 A | 8/2021 |
| KR | 10-2021-0148471 A | 12/2021 |

* cited by examiner

*Primary Examiner* — Karen Kusumakar
(74) *Attorney, Agent, or Firm* — IP & T GROUP LLP

(57) ABSTRACT

A semiconductor device includes: a dielectric structure in which etch stop structures and low-k layers are alternately stacked over a substrate; and a metal interconnection electrically connected to the substrate in the dielectric structure, wherein each one of the etch stop structures includes: a first etch stop layer including a hydrogen blocking material; and a second etch stop layer formed over the first etch stop layer.

21 Claims, 10 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2021-0179567, filed on Dec. 15, 2021, which is incorporated herein by reference in its entirety.

BACKGROUND

1. Field

Various embodiments of the present invention relate to a method for fabricating a semiconductor device, and more particularly, to a method for fabricating a semiconductor device including an etch stop layer provided with a hydrogen blocking material.

2. Description of the Related Art

A semiconductor fabrication process requires an etching process, which causes damage to the surface of a semiconductor substrate. As semiconductor devices tend to be highly integrated more and more, the spacing between patterns become smaller as well, which may also lead to increased damage to the surface of the substrate. As a result, dangling bonds of silicon forming the semiconductor substrate increase, which becomes a source of electron leakage current and may cause leakage current in a transistor.

SUMMARY

Embodiments of the present invention are directed to a semiconductor device with improved electrical characteristics and reliability, and a method for fabricating the semiconductor device.

In accordance with an embodiment of the present invention, a semiconductor device includes: a dielectric structure in which etch stop structures and low-k layers are alternately stacked over a substrate; and a metal interconnection electrically connected to the substrate in the dielectric structure, wherein each one of the etch stop structures includes: a first etch stop layer including a hydrogen blocking material; and a second etch stop layer formed over the first etch stop layer.

In accordance with another embodiment of the present invention, a method for fabricating a semiconductor device includes: forming a dielectric structure in which etch stop structures and low-k layers are alternately stacked over a substrate provided with a transistor including a gate dielectric layer; and forming a metal interconnection electrically connected to the substrate in the dielectric structure, wherein each one of the etch stop structures includes: a first etch stop layer including a hydrogen blocking material; and a second etch stop layer formed over the first etch stop layer.

DETAILED DESCRIPTION

Figure 1:
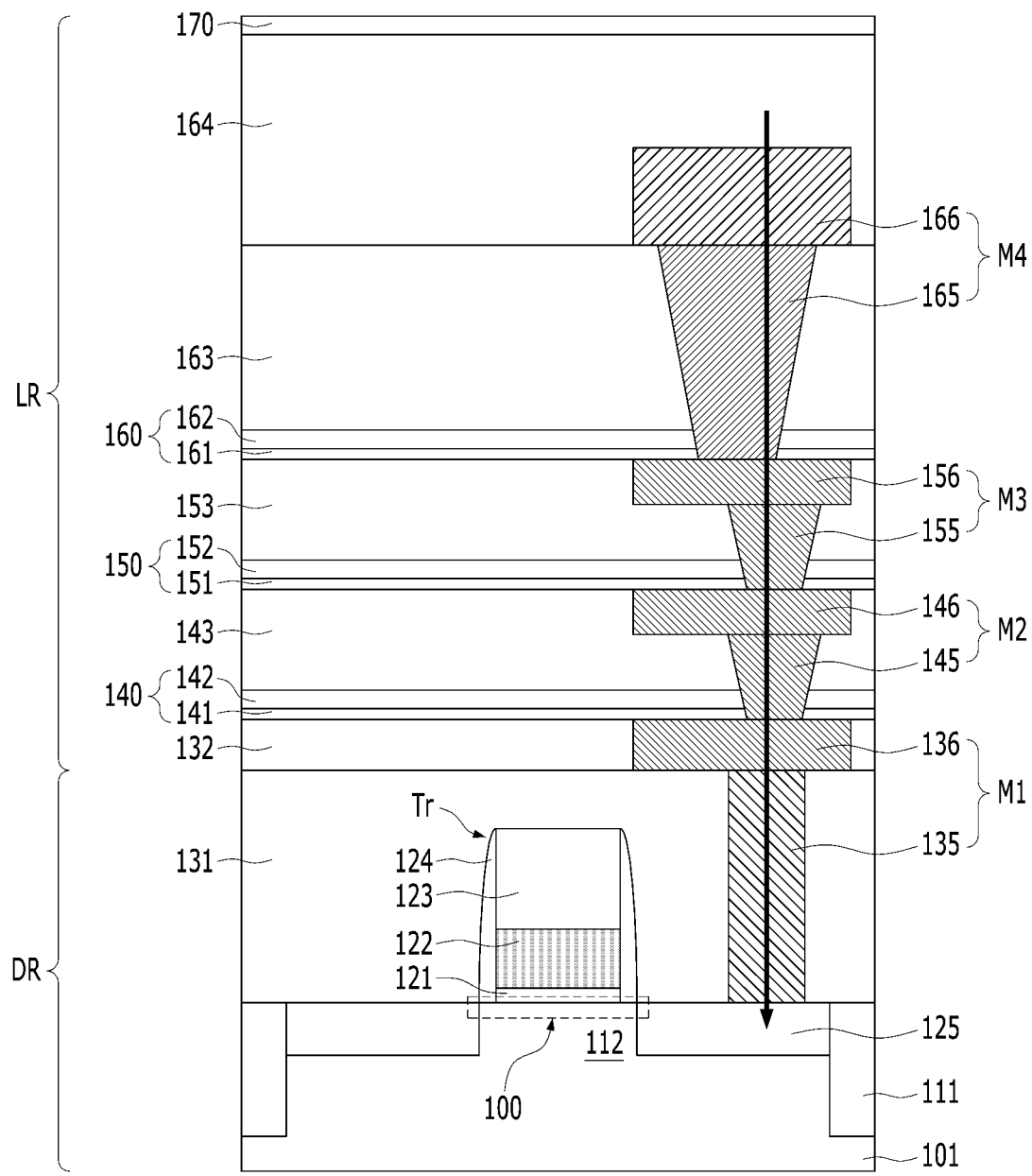
FIG. 1 is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device in accordance with an embodiment of the present invention.

Referring to FIG. 1, the semiconductor device may include a device region DR and an interconnection region LR. The device region DR may be a region including a substrate 101 and a plurality of transistors Tr formed over a substrate 101. The interconnection region LR may include a plurality of inter-metal dielectric layers 132, 143 and 153, a plurality of etch stop structures 140, 150 and 160, a plurality of inter-layer dielectric layers 131, 163 and 164, and a multi-level metal interconnection M1, M2, M3 and M4.

The substrate 101 may be a material appropriate for semiconductor processing. The substrate 101 may include a semiconductor substrate. The substrate 101 may include a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include other semiconductor materials, such as germanium. The substrate 101 may include a III/V-group semiconductor substrate, for example, a compound substrate such as GaAs. The substrate 101 may include a Silicon-On Insulator (SOI) substrate.

The substrate 101 may include an isolation layer 111 defining an active region 112. A transistor Tr including a stacked structure of a gate dielectric layer 121, a gate electrode 122 and a gate hard mask 123, and a gate spacer 124 formed on the sidewalls of the stacked structure may be formed over the active region 112. Impurity regions 125 may be formed on both sides of the transistor Tr in the substrate 101. The impurity regions 125 may be referred to as 'source/drain regions'.

The multi-level metal interconnections M1, M2, M3 and M4 may penetrate a plurality of inter-metal dielectric layers 132, 143 and 153. The inter-metal dielectric layers 132, 143 and 153 may include a dielectric material having a low dielectric constant to reduce the parasitic capacitance between the metal interconnections M1, M2, M3 and M4. The inter-metal dielectric layers 132, 143 and 153 may be referred to as 'low-k layers'. The inter-metal dielectric layers 132, 143 and 153 may include a low-k material having a lower dielectric constant than silicon oxide (SiO$_2$). For example, silicon oxide may have a dielectric constant of approximately 3.9 to 4.5. The inter-metal dielectric layers 132, 143 and 153 may have a dielectric constant of approximately 3.5 or less, for example, a dielectric constant of approximately 2.0 to 3.5. For example, the inter-metal dielectric layers 132, 143 and 153 may be made of silicon oxide containing carbon and hydrogen (SiCOH).

The inter-layer dielectric layers 131, 163 and 164 may be positioned over the transistor Tr and the substrate 101, and between and over the fourth metal interconnection M4, which is the uppermost metal interconnection. The inter-layer dielectric layers 131, 163 and 164 may include an oxide material having a higher dielectric constant than the inter-metal dielectric layers 132, 143 and 153. For example, the first and second inter-layer dielectric layers 131 and 163 may include tetra ethyl ortho silicate (TEOS) oxide. According to another embodiment of the present invention, the first and second inter-layer dielectric layers 131 and 163 may include silicon oxide having a dielectric constant of approximately 3.9 to 4.5.

The third inter-layer dielectric layer 164 may include silicon oxide including hydrogen. The third inter-layer dielectric layer 164 may include a dielectric material having a relatively higher hydrogen supply capability than the second inter-layer dielectric layer 163. For example, the third inter-layer dielectric layer 164 may include High Density Plasma (HDP) oxide. The third inter-layer dielectric layer 164 may be referred to as a 'hydrogen passivation layer' or a 'hydrogen supply layer'. When hydrogen is supplied through the hydrogen supply layer, it may be less affected by the layers blocking the diffusion of hydrogen, compared to annealing in a hydrogen gas atmosphere.

A passivation layer 170 may be formed over the third inter-layer dielectric layer 164. The passivation layer 170 may serve as a hydrogen source for supplying hydrogen to the surface of the substrate 101 together with the third inter-layer dielectric layer 164. The passivation layer 170 may serve to protect all the structures that are stacked in a direction perpendicular to the substrate 101. The passivation layer 170 may include, for example, silicon nitride.

During the hydrogen passivation process, hydrogen in the third inter-layer dielectric layer 164 may be diffused into the surface of the substrate 101 through the multi-level metal interconnections M1, M2, M3 and M4 that are electrically connected to the substrate 101. The surface of the substrate 101 to which hydrogen reaches may be an interface 100 between the transistor Tr and the substrate 101. Accordingly, trap sites of the interface 100 may be filled with the diffused hydrogens, which significantly reduces the interfacial trap density. Therefore, the leakage current characteristic of the transistor may be improved.

The etch stop structures 140, 150 and 160 may include a dielectric material having an etch selectivity with respect to the inter-layer dielectric layers 131, 163 and 164 and the inter-metal dielectric layers 132, 143 and 153. The etch stop structures 140, 150 and 160 may have higher film density and strength than the inter-metal dielectric layers 132, 143 and 153. The etch stop structures 140, 150 and 160 may prevent some gas from coming out of the inter-metal dielectric layers 132, 143 and 153 or from flowing into the etch stop structures 140, 150 and 160. In other words, the etch stop structures 140, 150 and 160 may suppress gases, for example, hydrogen (H$_2$), water vapor (H$_2$O), fluorine, chlorine, etc., from being out-gassed from the inter-metal dielectric layers 132, 143 and 153. Also, the etch stop structures 140, 150 and 160 may be provided to prevent hydrogen or water vapor from flowing into the inter-metal dielectric layers 132, 143 and 153.

The first etch stop structure 140 may include a stacked structure of a first etch stop layer 141 and a second etch stop layer 142. The second etch stop structure 150 may include a stacked structure of a third etch stop layer 151 and a fourth etch stop layer 152. The third etch stop structure 160 may include a stacked structure of a fifth etch stop layer 161 and a sixth etch stop layer 162. The thickness of each of the etch stop structures 140, 150 and 160 may be smaller than the thickness of each of the inter-metal dielectric layers 132, 143 and 153. The thickness of each of the etch stop structures 140, 150 and 160 may be smaller than the thickness of each of the inter-layer dielectric layers 131, 163 and 164. The thickness of the first, third, and fifth etch stop layers 141, 151 and 161 may be smaller than the thickness of the second, fourth, and sixth etch stop layers 142, 152 and 162, respectively. For example, when the thickness of the second etch stop layer 142 is approximately 250 Å to 700 Å, the thickness of the first etch stop layer 141 may be approximately 20 Å to 40 Å.

The first, third, and fifth etch stop layers 141, 151 and 161 may serve to prevent hydrogen in the lower layer from being diffused into the upper layer by an annealing process or the like. In other words, the first, third, and fifth etch stop layers 141, 151 and 161 may prevent hydrogen from being captured by the second, fourth and sixth etch stop layers 142, 152 and 162 by blocking the hydrogen in the lower layer from being diffused into the upper portion during the annealing process, which is performed for hydrogen diffusion into the surface of the substrate. After all, the first, third, and fifth etch stop layers 141, 151 and 161 may increase the efficiency of the annealing process for hydrogen diffusion by inducing concentration into a hydrogen transfer path.

Each of the first, third, and fifth etch stop layers 141, 151 and 161 may include a hydrogen blocking material. The first, third, and fifth etch stop layers 141, 151 and 161 may include a dielectric material having a higher silicon content in the layer than silicon nitride (Si$_3$N$_4$) having a stoichiometric composition. The first, third, and fifth etch stop layers 141, 151 and 161 may be formed of silicon-rich silicon nitride (SRN) having a higher silicon content than silicon nitride (Si$_3$N$_4$) having a stoichiometric composition. In particular, each of the first, third and fifth etch stop layers 141, 151 and 161 may be formed not by a separately performed deposition process but by a pre-treatment during the deposition process of each of the second, fourth, and sixth etch stop layers 142, 152 and 162. Each of the first, third, and fifth etch stop layers 141, 151 and 161 may be formed in-situ in the same chamber as that of each of the second, fourth and sixth etch stop layers 142, 152 and 162.

The second, fourth, and sixth etch stop layers 142, 152 and 162 may include a dielectric material having a lower dielectric constant than silicon nitride (Si$_3$N$_4$) having a stoichiometric composition. The second, fourth, and sixth etch stop layers 142, 152 and 162 may include carbon-containing nitride doped carbon (NDC). The second, fourth, and sixth etch stop layers 142, 152 and 162 may include Si, C, and N. For example, the second, fourth, and sixth etch stop layers 142, 152 and 162 may include SiCN.

Although the first to third etch stop structures are illustrated in this embodiment, according to another embodiment of the present invention, the etch stop structure may also be positioned between the first inter-layer dielectric layer 131 and the first inter-metal dielectric layer 132.

The multi-level metal interconnections M1, M2, M3 and M4 may include metal interconnection contacts and conductive lines. The metal interconnection contacts 135, 145, 155 and 165 may serve to electrically connect a lower conductive line and an upper conductive line to each other. Both ends of the first metal interconnection contact 135 may be coupled to the substrate 101 and a first conductive line 136 to electrically connect the substrate 101 and the first conductive line 136 to each other. Both ends of the second metal interconnection contact 145 may be coupled to the first conductive line 136 and the second conductive line 146 to electrically connect the first conductive line 136 and the second conductive line 146 to each other. Both ends of the third metal interconnection contact 155 may be coupled to the second conductive line 146 and the third conductive line 156 to electrically connect the second conductive line 146 and the third conductive line 156 to each other. Both ends of the fourth metal interconnection contact 165 may be coupled to the third conductive line 156 and the fourth conductive line 166 to electrically connect the third conductive line 156 and the fourth conductive line 166 to each other. Each of the conductive lines 136, 146, 156 and 166 may extend in one direction while contacting the upper surface of each of the metal interconnection contacts 135, 145, 155 and 165. A plurality of metal interconnection contacts 135, 145, 155 and 165 may be provided at the same level to be spaced apart from each other, and each of the conductive lines 136, 146, 156, and 166 may be coupled to a plurality of metal interconnection contacts that are positioned at the same level simultaneously.

The first to third conductive lines 136, 146, and 156 may include the same material. For example, the first to third conductive lines 136, 146, and 156 may include copper (Cu). A barrier layer may be formed at the interface between the first to third conductive lines 136, 146, and 156 and the inter-metal dielectric layers 132, 143 and 153. The barrier layer may include titanium, titanium nitride, tantalum, or tantalum nitride.

The fourth metal interconnection contact 165 may be the uppermost contact plug. The fourth metal interconnection contact 165 may include a material which is different from those of the first to third conductive lines 136, 146, and 156. The fourth metal interconnection contact 165 may include a conductive material having a lower resistance than the first to third conductive lines 136, 146, and 156. For example, the fourth metal interconnection contact 165 may include tungsten (W). A barrier layer may be formed at the interface between the fourth metal interconnection contact 165 and the second inter-layer dielectric layer 163. The barrier layer may include tungsten nitride.

The fourth conductive line 166 may be the uppermost conductive line. The fourth conductive line 166 may be formed over the fourth metal interconnection contact 165 and the second inter-layer dielectric layer 163. The fourth conductive line 166 may have a shape extending in one direction while contacting the upper surface of the fourth metal interconnection contact 165. The fourth conductive line 166 may include a conductive material having a lower resistance than the fourth metal interconnection contact 165. The fourth conductive line 166 may include a metal material whose corrosion that may occur due to oxidation is reduced. For example, the fourth conductive line 166 may include aluminum. In case of aluminum, when the surface is oxidized, aluminum oxide may be formed and used as an oxide film agent of the aluminum underneath.

In the fabrication process of a semiconductor device, for example, an oxidation process, a plasma etching process, and the like, a defect may occur in a unit device, thus deteriorating electrical characteristics. For example, a dangling bond may be formed at the interface between the silicon oxide layer of the unit device and the silicon substrate and between the gate oxide layer and the substrate, which may increase leakage current and thereby deteriorate electrical characteristics of the semiconductor device. In case of a Dynamic Random Access Memory (DRAM) semiconductor device, it is needed to perform an operation of restoring the existing data at a predetermined interval by using a refresh method for newly restoring data. In this case, the predetermined period may be referred to as a refresh period or a data retention time. In order to reduce the power consumption of the DRAM and increase the operation speed, it is required to decrease the data retention time. However, due to a structural defect in the silicon crystals such as a dangling bond, leakage current may increase in the transistors and the data retention time may also be decreased.

In order to solve the problem of the defects such as dangling bonds, a third inter-layer dielectric layer 164 may be formed over the uppermost metal interconnection (which is the fourth metal interconnection M4 in this embodiment) as a hydrogen supply layer, and hydrogen may be supplied to the interface between the substrate 101 and the transistor Tr through an annealing process.

As a comparative example, when silicon nitride ($Si_3N_4$) having a stoichiometric composition with a thickness similar to that of this embodiment is applied as an etch stop layer, the speed characteristics of a device may be deteriorated due to an increase in the dielectric constant of the entire dielectric layer, which may be a problem.

In contrast, according to the embodiment of the present invention, a low dielectric constant may be maintained by applying an etch stop layer having a lower dielectric constant than the silicon nitride ($Si_3N_4$) having a stoichiometric composition. Also, as silicon-rich silicon nitride having a higher silicon content but thinner than the silicon nitride ($Si_3N_4$) having a stoichiometric composition is applied to the lower portion of the etch stop layer as an etch stop layer, it is possible to prevent the hydrogen in the lower layer from being diffused into the upper layer during the annealing process for supplying hydrogen without any increase in the dielectric constant, and increase the efficiency of the annealing process for hydrogen diffusion by inducing concentration into the hydrogen transfer path.

Figure 2:
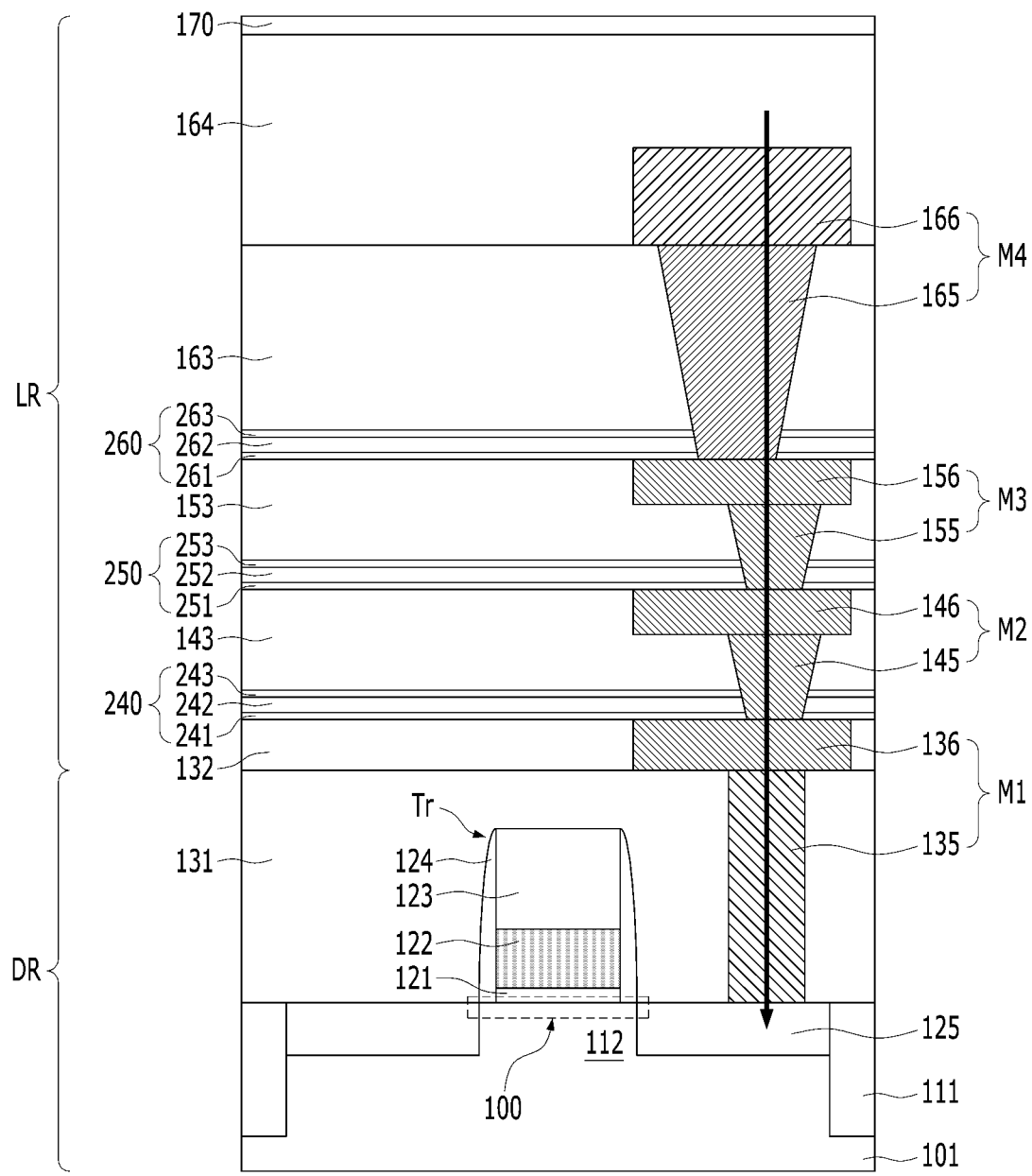
FIGS. 2 and 3 are cross-sectional views illustrating semiconductor devices in accordance with other embodiments of the present invention.
Figure 3:
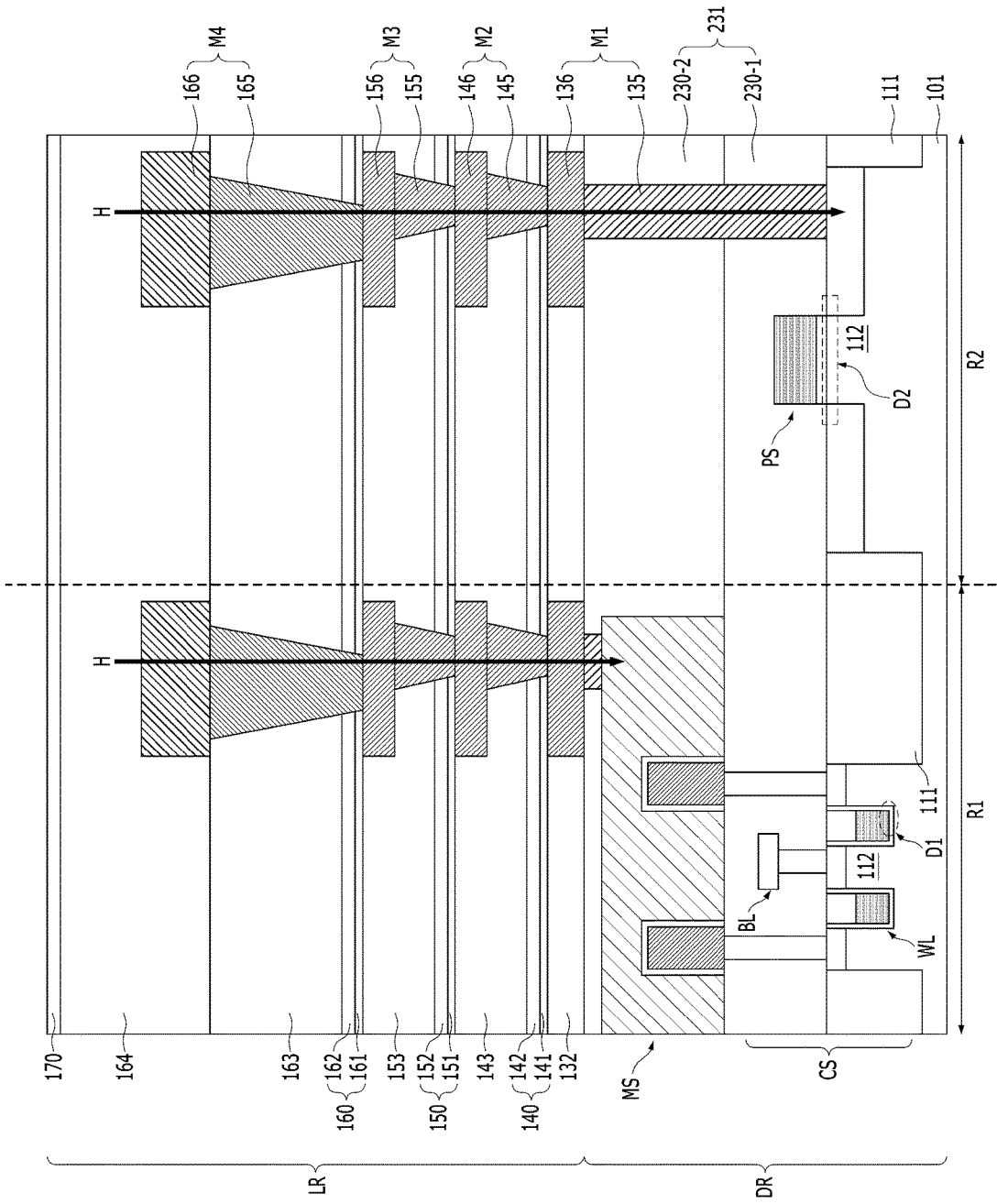

FIGS. 2 and 3 are cross-sectional views illustrating semiconductor devices in accordance with other embodiments of the present invention. FIG. 2 illustrates etch stop structures 240, 250 and 260 of structures different from that of FIG. 1. FIG. 3 illustrates a substrate and a device region of a structure different from that of FIG. 1. In FIGS. 2 and 3, the same reference numerals also appearing in FIG. 1 may indicate the same structures shown in FIG. 1. For the sake of convenience in description, description on the reference numerals also appearing in FIG. 1 will be omitted or they may be briefly described.

Referring to FIG. 2, the etch stop structures 240, 250 and 260 may include a dielectric material having an etch selectivity with respect to the inter-layer dielectric layers 131, 163 and 164 and the inter-metal dielectric layers 132, 143 and 153. The etch stop structures 240, 250 and 260 may have higher film density and strength than the inter-metal dielectric layers 132, 143 and 153. The etch stop structures 240, 250 and 260 may prevent some gas from coming out of the inter-metal dielectric layers 132, 143 and 153 or from flowing into the etch stop structures 240, 250 and 260. In other words, the etch stop structures 240, 250 and 260 may suppress the gases, for example, hydrogen (H$_2$), water vapor (H$_2$O), fluorine, chlorine, etc., from being out-gassed from the inter-metal dielectric layers 132, 143 and 153. Also, the etch stop structures 240, 250 and 260 may be provided to prevent hydrogen or water vapor from flowing into the inter-metal dielectric layers 132, 143 and 153.

The first etch stop structure 240 may include a stacked structure of first to third etch stop layers 241, 242, and 243. The second etch stop structure 250 may include a stacked structure of fourth to sixth etch stop layers 251, 252, and 253. The third etch stop structure 260 may include a stacked structure of seventh to ninth etch stop layers 261, 262, and 263. The thickness of each of the etch stop structures 240, 250 and 260 may be smaller than the thickness of each of the inter-metal dielectric layers 132, 143 and 153. The thickness of each of the etch stop structures 240, 250 and 260 may be smaller than the thickness of each of the inter-layer dielectric layers 131, 163 and 164. The thicknesses of the first, third, fourth, sixth, seventh, and ninth etch stop layers 241, 243, 251, 253, 261, and 263 may be smaller than the thicknesses of the second, fifth and eighth etch stop layers 242, 252 and 262. For example, when the thickness of the second etch stop layer 242 is approximately 250 Å to 700 Å, the thicknesses of the first and third etch stop layers 241 and 243 may be approximately 20 Å to 40 Å, but the concept and spirit of the present embodiment are not limited thereto.

The first, third, fourth, sixth, seventh, and ninth etch stop layers 241, 243, 251, 253, 261 and 263 may serve to prevent hydrogen diffusing from the lower layer or the upper layer to the upper layer or the lower layer by an annealing process, etc., In other words, the first, third, fourth, sixth, seventh, and ninth etch stop layers 241, 243, 251, 253, 261 and 263 may prevent hydrogen out-gassing, in which the hydrogen in the lower layer is diffused into the upper portion, during the annealing process for diffusing hydrogen into the surface of the substrate. Also, it is possible to prevent the hydrogen diffused from the upper layer from being captured by the second, fifth, and eighth etch stop layers 242, 252, and 262 while coming down to the lower layer.

Consequently, the first, third, fourth, sixth, seventh and ninth etch stop layers 241, 243, 251, 253, 261 and 263 may prevent the loss of hydrogen that may occur due to the hydrogen out-gassing and unnecessary hydrogen capture, and induce concentration into the hydrogen transfer path. Therefore, it is possible to increase the efficiency of the annealing process for hydrogen diffusion into the substrate.

According to another embodiment of the present invention, an etch stop layer including a hydrogen blocking material may be applied to the interface between the metal interconnections M1, M2, M3 and M4 and the etch stop structures 240, 250 and 260.

Each of the first, third, fourth, sixth, seventh, and ninth etch stop layers 241, 243, 251, 253, 261 and 263 may include a hydrogen blocking material. The first, third, fourth, sixth, seventh, and ninth etch stop layers 241, 243, 251, 253, 261 and 263 may include a dielectric material having a higher silicon content in the layer than silicon nitride (Si$_3$N$_4$) having a stoichiometric composition. The first, third, fourth, sixth, seventh, and ninth etch stop layers 241, 243, 251, 253, 261 and 263 may include silicon-rich silicon nitride (SRN) having a higher silicon content than silicon nitride (Si$_3$N$_4$) having a stoichiometric composition. In particular, the first, fourth, and seventh etch stop layers 241, 251, and 261 may be formed not by a separately performed deposition process but by a pre-treatment process during a deposition process of the second, fifth and seventh etch stop layers 242, 252, and 262. The third, sixth and ninth etch stop layers 243, 253 and 263 may be formed not by a separately performed deposition process but by a pre-treatment process during a deposition process of the upper dielectric layers of the third, sixth and ninth etch stop layers 243, 253 and 263. For example, the first etch stop layer 241 may be formed by a pre-treatment process during a deposition process of the second etch stop layer 242. The third etch stop layer 243 may be formed by a pre-treatment process during a deposition process of the second inter-metal dielectric layer 143.

The second, fifth, and eighth etch stop layers 242, 252, and 262 may include a dielectric material having a lower dielectric constant than silicon nitride (Si$_3$N$_4$) having a stoichiometric composition. The second, fifth, and eighth etch stop layers 242, 252, and 262 may include carbon-containing nitride doped carbon (NDC). The second, fifth, and eighth etch stop layers 242, 252 and 262 may include Si, C and N. For example, the second, fifth, and eighth etch stop layers 242, 252 and 262 may include SiCN.

Although the first to third etch stop structures are illustrated in this embodiment, according to another embodiment of the present invention, an etch stop structure may also be positioned between the first inter-layer dielectric layer 131 and the first inter-metal dielectric layer 132.

Referring to FIG. 3, the semiconductor device may include a device region DR and an interconnection region LR. The device region DR may be a region including the substrate 101 and a plurality of transistors formed thereon. When the semiconductor device of the present invention is a memory device, the device region DR may include a cell array region R1 and a peripheral circuit region R2 for driving the cell array region R1. The cell array region R1 may be a region where memory cells are disposed. The peripheral circuit region R2 may be a region where a word line driver, a sense amplifier, row and column decoders, and control circuits are disposed. When the semiconductor device of the present invention is a non-memory device, the device region DR may not include the cell array region R1.

The cell array region R1 may include a cell transistor region CS and an information storage structure MS over the cell transistor region CS. When the semiconductor memory device of the present invention is a DRAM device, the information storage structure MS may include capacitors. The capacitors may include a stacked structure of a lower electrode, a dielectric layer, and an upper electrode.

The cell transistor region CS may include unit memory cells which include an active region 112 defined by an isolation layer 111, word lines WL formed in the active region 112, and bit lines BL formed over the active region 112. A plurality of impurity regions that are separated from each other by the word lines WL may be provided in the active region 112. From the perspective of a plan view, the bit lines BL may extend in a direction crossing the word lines WL. The bit lines BL may be electrically connected to the substrate 101 through bit line contacts. The capacitors may be electrically connected to the substrate 101 through storage node contacts. Although the present embodiment has been described with reference to a DRAM, the semiconductor memory device of the present invention is not limited to a DRAM, and may be a memory device including a variable resistor, such as a phase change material.

The peripheral circuit region R2 may include a peripheral transistor region PS. The peripheral transistor region PS may include an active region 112 defined by the isolation layer 111 and a transistor formed over the active region 112.

A plurality of inter-metal dielectric layers 132, 143 and 153, a plurality of etch stop structures 140, 150 and 160, a plurality of inter-layer dielectric layers 231, 163, and 164, and multi-level metal interconnections M1, M2, M3 and M4 may be included in the substrate 101, the cell transistor region CS, and the peripheral transistor region PS of the cell array region R1 and the peripheral circuit region R2.

Although the multi-level metal interconnections M1, M2, M3 and M4, and a plurality of etch stop structures 140, 150 and 160 are included in each of the cell array region R1 and the peripheral circuit region R2 according to this embodiment of the present invention, according to another embodiment of the present invention, a plurality of etch stop structures 140, 150 and 160 may be applied only to the multi-level metal interconnections M1, M2, M3 and M4 of one region among the cell array region R1 and the peripheral circuit regions R2.

The multi-level metal interconnections M1, M2, M3 and M4 may penetrate the inter-metal dielectric layers 132, 143 and 153. The inter-metal dielectric layers 132, 143 and 153 may include a dielectric material having a low dielectric constant in order to reduce the parasitic capacitance between the metal interconnections M1, M2, M3 and M4. For example, the inter-metal dielectric layers 132, 143 and 153 may be made of silicon oxide containing carbon and hydrogen (SiCOH).

The inter-layer dielectric layers 231, 163, and 164 may be positioned over the transistor Tr and the substrate 101, and between and over the fourth metal interconnections M4 which are the uppermost metal interconnections. The inter-layer dielectric layers 231, 163, and 164 may include an oxide material having a higher dielectric constant than the inter-metal dielectric layers 132, 143 and 153. For example, the first and second inter-layer dielectric layers 231 and 163 may include tetra ethyl ortho silicate (TEOS) oxide. According to another embodiment of the present invention, the first and second inter-layer dielectric layers 231, and 163 may include silicon oxide having a dielectric constant of approximately 3.9 to 4.5. According to the structure of the device region DR, the first inter-layer dielectric layer 231 according to the embodiment of the present invention may be formed as multi-layers 230-1 and 230-2.

The third inter-layer dielectric layer 164 may include silicon oxide including hydrogen. The third inter-layer dielectric layer 164 may include a dielectric material having a relatively high hydrogen supply capability compared to that of the second inter-layer dielectric layer 163. For example, the third inter-layer dielectric layer 164 may include High Density Plasma (HDP) oxide. The third inter-layer dielectric layer 164 may be referred to as a 'hydrogen passivation layer' or a 'hydrogen supply layer'. When hydrogen is supplied through the hydrogen supply layer, it may be less affected by the layers blocking the diffusion of hydrogen, compared to annealing in the atmosphere of hydrogen gas.

A passivation layer 170 may be formed over the third inter-layer dielectric layer 164. The passivation layer 170 may serve as a hydrogen source for supplying hydrogen to the surface of the substrate 101 together with the third inter-layer dielectric layer 164. The passivation layer 170 may serve to protect all the structures that are stacked in a direction perpendicular to the substrate 101. The passivation layer 170 may include, for example, silicon nitride.

During a hydrogen passivation process, hydrogen in the third inter-layer dielectric layer 164 may be diffused to the surface of the substrate 101 through the multi-level metal interconnections M1, M2, M3 and M4 that are electrically connected to the substrate 101. The surface of the substrate 101 to which hydrogen reaches may be the interface D1 of the gate dielectric layer forming the word line WL in the cell array region R1 and the interface D2 between the peripheral transistor region PS and the substrate 101 in the peripheral circuit region R2. Accordingly, trap sites of each of the interfaces D1 and D2 may be filled with diffused hydrogen to significantly reduce the interface trap density. Therefore, the leakage current characteristic of the transistor may be improved.

The etch stop structures 140, 150 and 160 may include a dielectric material having an etch selectivity with respect to the inter-layer dielectric layers 231, 163 and 164 and the inter-metal dielectric layers 132, 143 and 153. The etch stop structures 140, 150 and 160 may have a higher film density and strength than the inter-metal dielectric layers 132, 143 and 153. The etch stop structures 140, 150 and 160 may prevent some gas from coming out of the inter-metal dielectric layers 132, 143 and 153 or from flowing into the etch stop structures 140, 150 and 160. In other words, the etch stop structures 140, 150 and 160 may suppress the gases, for example, hydrogen ($H_2$), water vapor ($H_2O$), fluorine, chlorine, etc., from being out-gassed from the inter-metal dielectric layers 132, 143 and 153. Also, the etch stop structures 140, 150 and 160 may be provided to prevent hydrogen or water vapor from flowing into the inter-metal dielectric layers 132, 143 and 153.

The etch stop structures 140, 150 and 160 of FIG. 3 may include the same stacked structure as that of the etch stop structures 140, 150 and 160 shown in FIG. 1. According to another embodiment of the present invention, the etch stop structures 140, 150 and 160 of FIG. 3 may be replaced with the etch stop structures 240, 250 and 260 of FIG. 2.

The first etch stop structure 140 may include a stacked structure of a first etch stop layer 141 and a second etch stop layer 142. The second etch stop structure 150 may include a stacked structure of a third etch stop layer 151 and a fourth etch stop layer 152. The third etch stop structure 160 may include a stacked structure of a fifth etch stop layer 161 and a sixth etch stop layer 162. The thickness of each of the etch stop structures 140, 150 and 160 may be smaller than the thickness of each of the inter-metal dielectric layers 132, 143 and 153. The thickness of each of the etch stop structures 140, 150 and 160 may be smaller than the thickness of each of the inter-layer dielectric layers 231, 163 and 164. The thickness of the first, third, and fifth etch stop layers 141, 151 and 161 may be smaller than the thickness of the second, fourth, and sixth etch stop layers 142, 152 and 162. For example, when the thickness of the second etch stop layer 142 is approximately 250 Å to 700 Å, the thickness of the first etch stop layer 141 may be approximately 20 Å to 40 Å.

The first, third, and fifth etch stop layers 141, 151 and 161 may serve to prevent hydrogen in the lower layer from being diffused into the upper layer by an annealing process or the like. In other words, the first, third, and fifth etch stop layers 141, 151 and 161 may block the diffusion of hydrogen in the lower layer to the upper portion during the annealing process for diffusing hydrogen into the surface of the substrate and prevent hydrogen from being captured by the second, fourth and sixth etch stop layers 142, 152 and 162. As a result, the first, third, and fifth etch stop layers 141, 151 and 161 may increase the efficiency of an annealing process for hydrogen diffusion by inducing concentration into a hydrogen transfer path.

Each of the first, third, and fifth etch stop layers 141, 151 and 161 may include a hydrogen blocking material. The first, third, and fifth etch stop layers 141, 151 and 161 may include a dielectric material having a higher silicon content than silicon nitride ($Si_3N_4$) having a stoichiometric composition. The first, third, and fifth etch stop layers 141, 151 and 161 may be formed of silicon-rich silicon-nitride (SRN) having a higher silicon content than the silicon nitride ($Si_3N_4$) having a stoichiometric composition. In particular, each of the first, third and fifth etch stop layers 141, 151 and 161 may be formed not by a separately performed deposition process but by a pre-treatment during a deposition process of each of the second, fourth and sixth etch stop layers 142, 152 and 162. Each of the first, third, and fifth etch stop layers 141, 151 and 161 may be formed in-situ in the same chamber as that of each of the second, fourth and sixth etch stop layers 142, 152 and 162.

The second, fourth, and sixth etch stop layers 142, 152 and 162 may include a dielectric material having a lower dielectric constant than silicon nitride ($Si_3N_4$) having a stoichiometric composition. The second, fourth, and sixth etch stop layers 142, 152 and 162 may include carbon-containing nitride doped carbon (NDC). The second, fourth, and sixth etch stop layers 142, 152 and 162 may include Si, C, and N. For example, the second, fourth, and sixth etch stop layers 142, 152 and 162 may include SiCN.

The multi-level metal interconnections M1, M2, M3 and M4 may include metal interconnection contacts and conductive lines.

FIGS. 4A to 4G are cross-sectional views illustrating a method for fabricating a semiconductor device in accordance with an embodiment of the present invention. Although FIGS. 4A to 4G illustrate a method for fabricating the semiconductor device shown in FIG. 1, it may also be applied to the method of fabricating the semiconductor device shown in FIGS. 2 and 3.

Figure 4A:
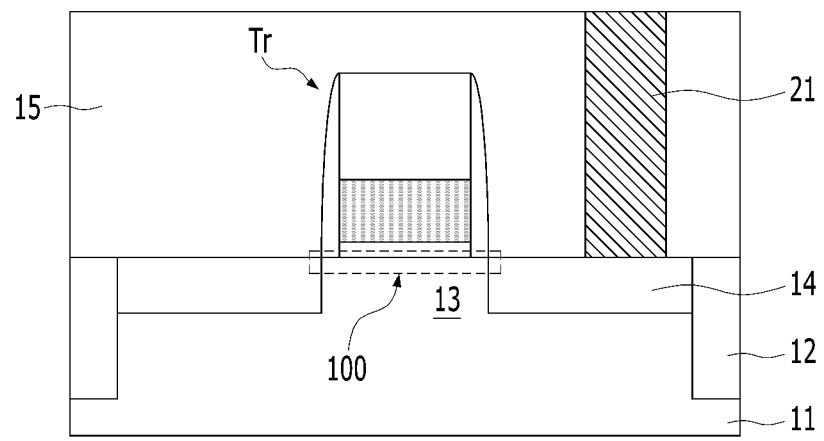
FIGS. 4A to 4G are cross-sectional views illustrating a method for fabricating a semiconductor device in accordance with an embodiment of the present invention.

Referring to FIG. 4A, an isolation layer 12 and an active region 13 may be formed in a substrate 11.

The active region 13 may be defined by the isolation layer 12. The isolation layer 12 may be formed by a Shallow Trench Isolation (STI) process.

Subsequently, a transistor Tr may be formed over the substrate 11. The transistor Tr may have the same structure as that of the transistor Tr shown in FIG. 1.

Subsequently, impurity regions 14 may be formed in the substrate on both sides of the transistor Tr. The impurity regions 14 may be referred to as 'source/drain regions'. The impurity regions 14 may include an N-type impurity, such as arsenic (As) or phosphorus (P).

Subsequently, a first inter-layer dielectric layer 15 may be formed over the substrate 11 including the transistor Tr. The upper surface of the first inter-layer dielectric layer 15 may be positioned at a higher level than the upper surface of the transistor Tr. For example, the first inter-layer dielectric layer 15 may include TEOS oxide. According to another embodiment of the present invention, the first inter-layer dielectric layer 15 may include silicon oxide having a dielectric constant of approximately 3.9 to 4.5.

Subsequently, a first metal interconnection contact 21 coupled to the substrate 11 may be formed through the first inter-layer dielectric layer 15. The substrate 11 to which the first metal interconnection contact 21 is coupled may be an impurity region 14. During the subsequent hydrogen passivation process, hydrogen transferred through the first metal interconnection contact 21 may be supplied to the interface 100 between the transistor Tr and the substrate 11 through the impurity region 14.

Figure 4B:
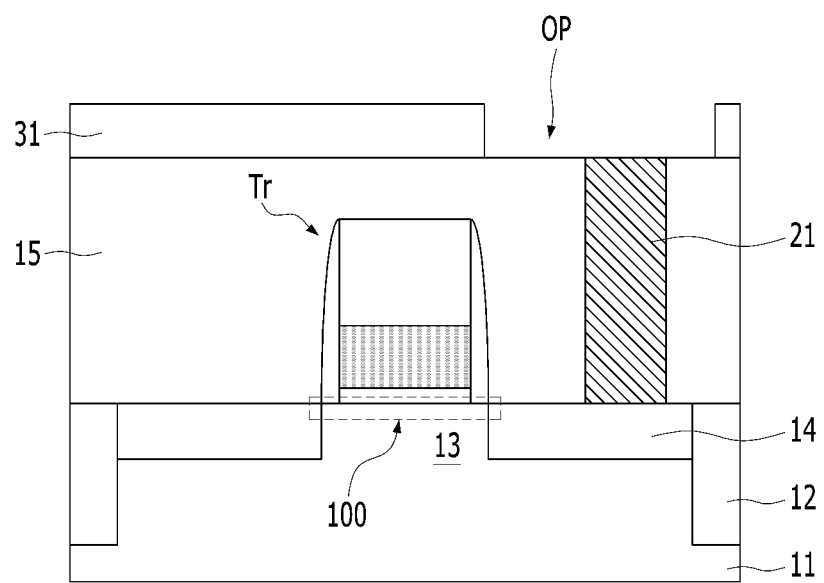
Figure 4C:
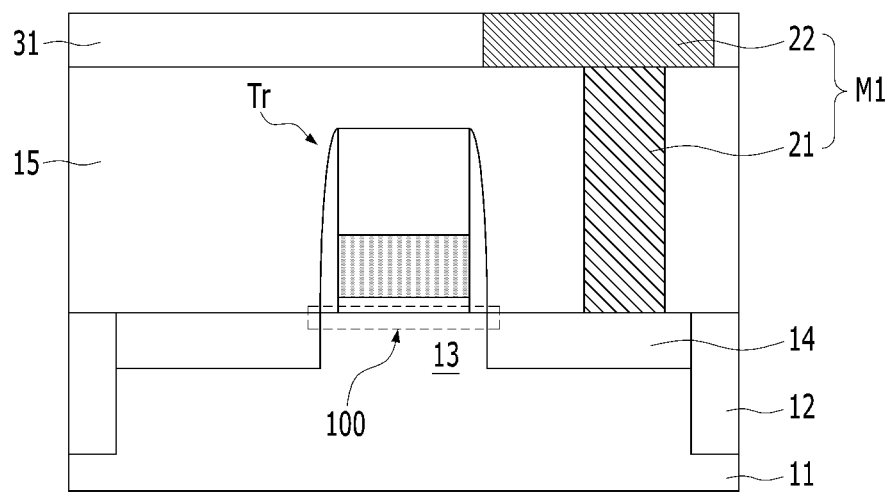

Referring to FIGS. 4B and 4C, a first inter-metal dielectric layer 31 including an opening OP may be formed over the first inter-layer dielectric layer 15 and the first metal interconnection contact 21.

To this end, a low-k material layer may be formed over the first inter-layer dielectric layer 15 and the first metal interconnection contact 21, and a mask pattern for opening a conductive line region may be formed over the low-k material layer. Subsequently, a series of processes for etching the low-k material layer may be performed by using the mask pattern.

The first inter-metal dielectric layer 31 may include a low-k material having a lower dielectric constant than silicon oxide ($SiO_2$). The first inter-metal dielectric layer 31 may be referred to as a 'low-k layer'. For example, silicon oxide may have a dielectric constant of approximately 3.9 to 4.5. The first inter-metal dielectric layer 31 may have a dielectric constant of approximately 3.5 or less, for example, a dielectric constant of approximately 2.0 to 3.5. For example, the first inter-metal dielectric layer 31 may be silicon oxide including carbon and hydrogen (SiCOH).

Subsequently, a first conductive line 22 for gap-filling the opening OP may be formed. The first conductive line 22 may be formed by a series of processes of forming a conductive material over the first inter-metal dielectric layer 31 including the opening OP, and etching a conductive material by using a target that exposes the upper surface of the first inter-metal dielectric layer 31. A barrier layer may be formed at the interface between the first inter-metal dielectric layer 31 and the first conductive line 22. The first metal interconnection contact 21 and the first conductive line 22 may be referred to as a first metal interconnection M1.

Figure 4D:
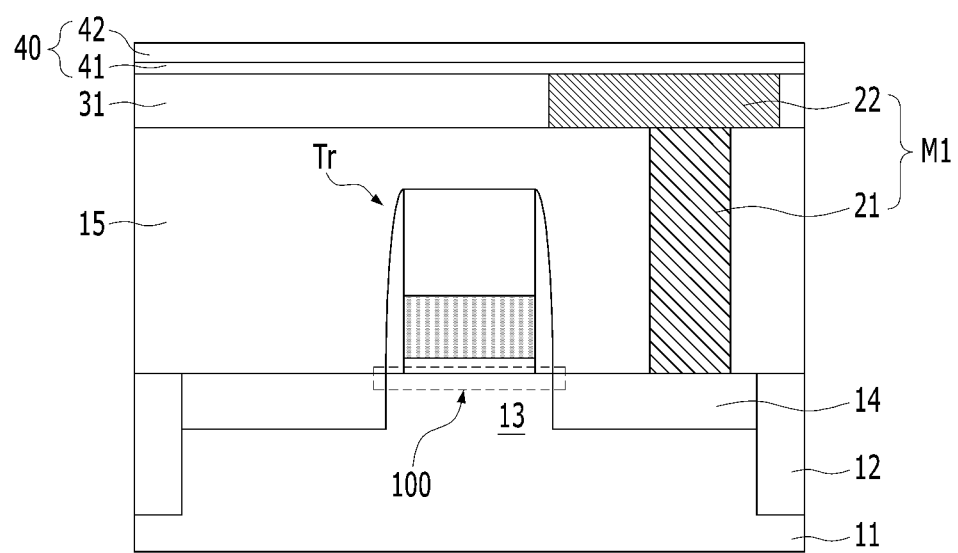
Figure 4E:
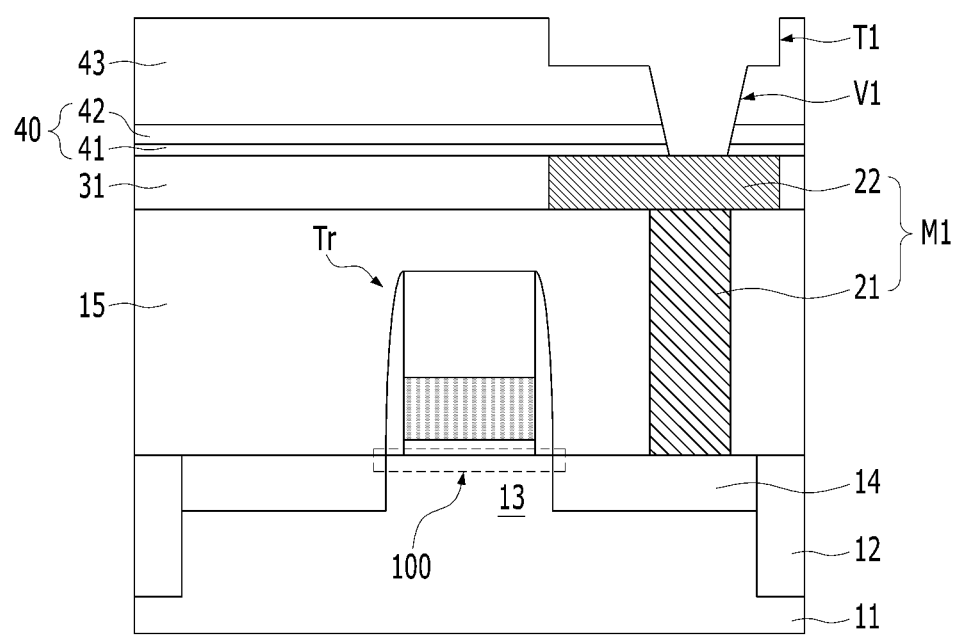
Figure 4F:
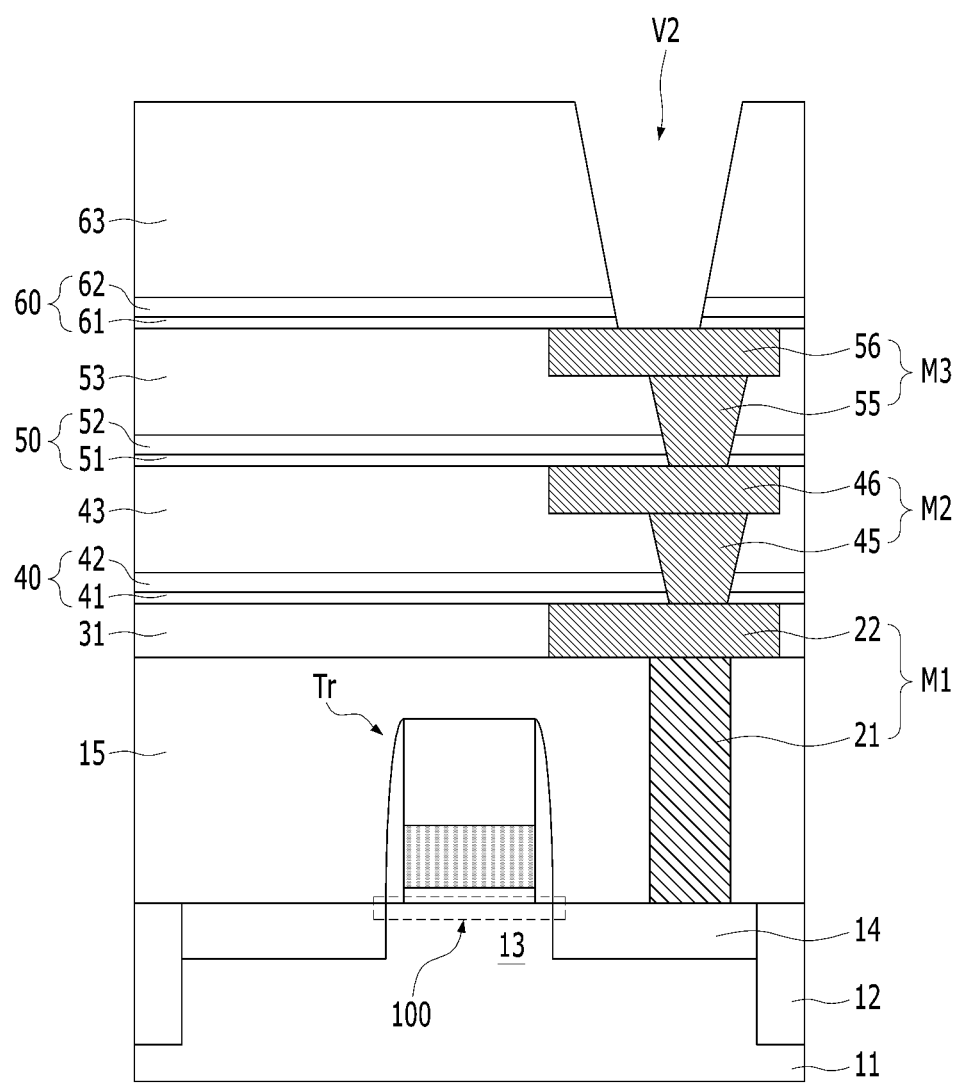

Referring to FIGS. 4D to 4F, a first etch stop structure 40 may be formed over the first inter-metal dielectric layer 31 including the first metal interconnection M1.

The first etch stop structure 40 may include a stacked structure of the first etch stop layer 41 and the second etch stop layer 42. The thickness of the first etch stop layer 41 may be smaller than the thickness of the second etch stop layer 42.

The first etch stop layer 41 may include a hydrogen blocking material. The first etch stop layer 41 may include a dielectric material having a higher silicon content than silicon nitride ($Si_3N_4$) having a stoichiometric composition. The first etch stop layer 41 may include silicon-rich silicon nitride (SRN) having a higher silicon content than silicon nitride ($Si_3N_4$) having a stoichiometric composition. In particular, the first etch stop layer 41 may be formed not by a separately performed deposition process but by a pre-treatment during a deposition process of the second etch stop layer 42. The first etch stop layer 41 may be formed in-situ in the same chamber as that of the second etch stop layer 42.

The second etch stop layer 42 may include a dielectric material having a lower dielectric constant than silicon nitride ($Si_3N_4$) having a stoichiometric composition. The second etch stop layer 42 may include carbon-containing silicon nitride (NDC). The second etch stop layer 42 may include Si, C and N. For example, the second etch stop layer 42 may include SiCN.

Although the structure of the etch stop structure shown in FIG. 1 is illustrated in the embodiment of the present invention, it is obvious to those skilled in the art that the structure of the etch stop structure shown in FIG. 2 may be applied as well.

Subsequently, a second inter-metal dielectric layer 43 may be formed over the first etch stop structure 40. The second inter-metal dielectric layer 43 may include the same material as that of the first inter-metal dielectric layer 31. The thickness of the second inter-metal dielectric layer 43 may be greater than the entire thickness of the first etch stop structure 40.

Subsequently, the second inter-metal dielectric layer 43 and the first etch stop structure 40 may be etched to form a via V1 and a trench T1.

The via V1 and the trench T1 may be formed by separate processes using masks. According to another embodiment of the present invention, the via V1 and the trench T1 may be formed by a separate etching process using a single mask whose width is adjusted through a trimming process. For example, the trench T1 may be formed, after the via V1 is formed. According to another embodiment of the present invention, the via V1 may be formed after the trench T1 is formed.

Figure 4G:
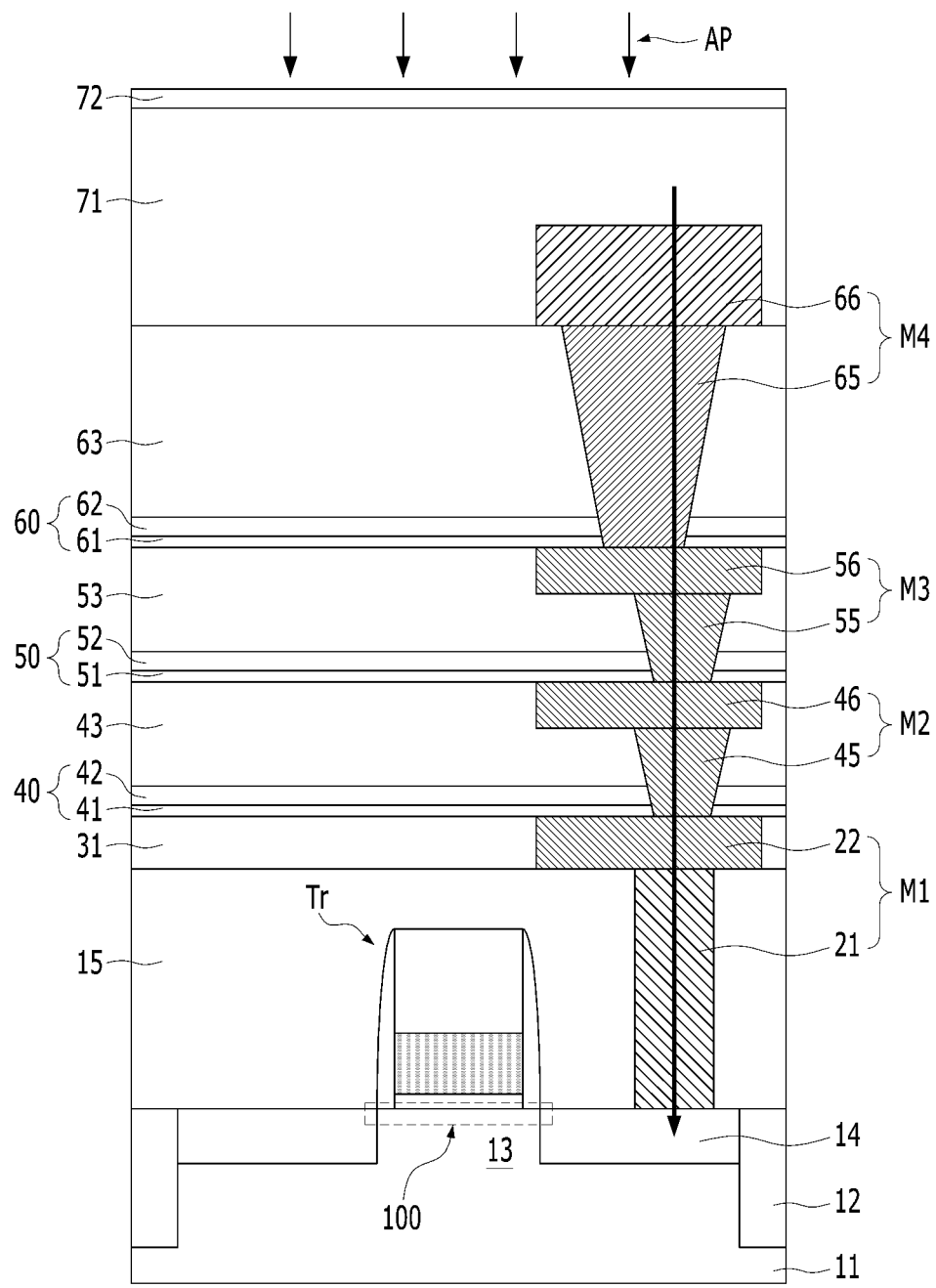

Referring to FIGS. 4F and 4G, a second metal interconnection M2 may be formed in the via (V1, see FIG. 4E) and the trench (T1, see FIG. 4E).

The second metal interconnection M2 may include a second metal interconnection contact 45 filling the via V1, and a second conductive line 46 filling the trench T1. A barrier layer may be formed at the interface between the via V1 and the trench T1 and the second metal interconnection M2. The barrier layer may include titanium, titanium nitride, tantalum, or tantalum nitride.

The second metal interconnection contact 45 and the second conductive line 46 may include the same material. The second metal interconnection M2 may include, for example, copper (Cu). The second metal interconnection M2 may be formed by forming a conductive material filling the via V1 and the trench T1 and performing a damascene process in which a planarization process is performed. The second metal interconnection M2 may be formed by forming a seed layer and performing an electroplating process. After the electroplating process is performed, a separate annealing process may be further performed.

Subsequently, a second etch stop structure 50 and a third inter-metal dielectric layer 53 including the third metal interconnection M3 may be formed over the second inter-metal dielectric layer 43 including the second metal interconnection M2 by repeating the processes of FIGS. 4D and 4E and the conductive material forming process.

Subsequently, a third etch stop structure 60 and a second inter-layer dielectric layer 63 may be sequentially formed over the third inter-metal dielectric layer 53.

The third etch stop structure 60 may be formed by the same process as those of the first and second etch stop structures 40 and 50 (see FIG. 4E).

The second inter-layer dielectric layer 63 may include the same material as that of the first inter-layer dielectric layer 15. The second inter-layer dielectric layer 63 may include, for example, tetra ethyl ortho silicate (TEOS) oxide. According to another embodiment of the present invention, the second inter-layer dielectric layer 63 may include silicon oxide having a dielectric constant of approximately 3.9 to 4.5.

Subsequently, a via V2 exposing a portion of the third metal interconnection M3 may be formed through the second inter-layer dielectric layer 63 and the third etch stop structure 60.

Subsequently, a fourth metal interconnection contact 65 for gap-filling the via V2 may be formed. The fourth metal interconnection contact 65 may be the uppermost contact plug. The fourth metal interconnection contact 65 may include a material which is different from those of the first to third metal interconnections M1, M2 and M3. The fourth metal interconnection contact 65 may include a conductive material having a lower resistance than the first to third metal interconnections M1, M2 and M3. For example, the fourth metal interconnection contact 65 may include tungsten (W). A barrier layer may be formed at the interface between the fourth metal interconnection contact 65 and the second inter-layer dielectric layer 63. The barrier layer may include tungsten nitride.

Subsequently, a fourth conductive line 66 may be formed over the fourth metal interconnection contact 65 and the second inter-layer dielectric layer 63. The fourth metal interconnection contact 65 and the fourth conductive line 66 may be referred to as a fourth metal interconnection M4. Although the fourth metal interconnection M4 is illustrated as the uppermost metal interconnection in this embodiment, the concept and spirit of the present invention are not limited thereto.

The fourth conductive line 66 may have a shape extending in one direction while contacting the upper surface of the fourth metal interconnection contact 65. The fourth conductive line 66 may include a conductive material having a lower resistance than that of the fourth metal interconnection contact 65. The fourth conductive line 66 may include a metal material whose corrosion that may occur due to oxidation is reduced. For example, the fourth conductive line 66 may include aluminum. In case of aluminum, when the surface is oxidized, aluminum oxide may be formed and serve as an oxide film agent of the aluminum underneath.

Subsequently, a third inter-layer dielectric layer 71 may be formed over the second inter-layer dielectric layer 63 and the fourth conductive line 66. The third inter-layer dielectric layer 71 may include silicon oxide including hydrogen. For example, the third inter-layer dielectric layer 71 may include HDP oxide. The third inter-layer dielectric layer 71 may be referred to as a 'hydrogen passivation layer' or a 'hydrogen supply layer'.

Subsequently, a passivation layer 72 may be formed over the third inter-layer dielectric layer 71. The passivation layer 72 may include, for example, silicon nitride.

Subsequently, an annealing process AP for supplying hydrogen in the third inter-layer dielectric layer 71 to the surface of the substrate 11 (which is the interface 100 between the substrate 11 and the transistor Tr) may be performed.

The heat of the annealing process may be applied from the side of the passivation layer 72, and hydrogen may be transferred to the substrate 11 through a hydrogen transfer path including the metal interconnections. The passivation layer 72 may prevent hydrogen from being discharged to a direction opposite to the hydrogen transfer path during the annealing process.

According to the embodiment of the present invention, leakage current characteristics of a device may be improved by increasing the efficiency of hydrogen passivation, thereby securing reliability.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a dielectric structure in which etch stop structures and low-k layers are alternately stacked over a substrate; and
a metal interconnection electrically connected to the substrate in the dielectric structure,
wherein each one of the etch stop structures includes:
a first etch stop layer which is a silicon-rich silicon nitride having a higher silicon content than silicon nitride ($Si_3N_4$); and a second etch stop layer which is a silicon nitride containing carbon on the first etch stop layer.

2. The semiconductor device of claim 1, wherein the second etch stop layer includes SiCN.

3. The semiconductor device of claim 1, wherein a thickness of the first etch stop layer is smaller than a thickness of the second etch stop layer.

4. The semiconductor device of claim 1, wherein a thickness of each of the etch stop structures is smaller than a thickness of each of the low-k layers.

5. The semiconductor device of claim 1, wherein the low-k layers include silicon oxide (SiCOH) containing carbon and oxygen.

6. The semiconductor device of claim 1, further comprising:
a hydrogen supply layer over the dielectric structure.

7. The semiconductor device of claim 6, wherein the hydrogen supply layer includes High Density Plasma (HDP) oxide, silicon nitride, or a combination thereof.

8. The semiconductor device of claim 1, wherein the etch stop structure further includes:
a third etch stop layer including another hydrogen blocking material over the second etch stop layer.

9. The semiconductor device of claim 8, wherein the third etch stop layer includes a silicon-rich silicon nitride having a higher silicon content than silicon nitride ($Si_3N_4$).

10. The semiconductor device of claim 1, wherein the metal interconnection includes a multi-level metal interconnection.

11. The semiconductor device of claim 1, wherein the substrate is provided with a transistor including a gate dielectric layer.

12. A method for fabricating a semiconductor device, comprising:
forming a dielectric structure in which etch stop structures and low-k layers are alternately stacked over a substrate provided with a transistor including a gate dielectric layer; and
forming a metal interconnection electrically connected to the substrate in the dielectric structure,
wherein each one of the etch stop structures includes:
a first etch stop layer which is a silicon-rich silicon nitride having a higher silicon content than silicon nitride ($Si_3N_4$); and
a second etch stop layer which is a silicon nitride containing carbon on the first etch stop layer.

13. The method of claim 12, further comprising:
performing an annealing process for supplying hydrogen to a surface of the substrate, after the forming of the metal interconnection electrically connected to the substrate in the dielectric structure.

14. The method of claim 12, further comprising:
after the forming of the metal interconnection electrically connected to the substrate in the dielectric structure,
forming a hydrogen supply layer over the dielectric structure; and
performing an annealing process for supplying hydrogen to a surface of the substrate.

15. The method of claim 12, wherein the first and second etch stop layers are formed in-situ in the same chamber.

16. The method of claim 12, wherein the second etch stop layer includes SiCN.

17. The method of claim 12, wherein each one of the low-k layers includes silicon oxide (SiCOH) containing carbon and oxygen.

18. The method of claim 14, wherein the hydrogen supply layer includes High Density Plasma (HDP) oxide, silicon nitride, or a combination thereof.

19. The method of claim 13, wherein the annealing process is performed in an atmosphere of hydrogen or deuterium.

20. The method of claim 12, wherein each one of the etch stop structures further includes:
a third etch stop layer including another hydrogen blocking material over the second etch stop layer.

21. The method of claim 20, wherein the third etch stop layer includes a silicon-rich silicon nitride having a higher silicon content than silicon nitride ($Si_3N_4$).

* * * * *